United States Patent [19]

Distefano et al.

[11] Patent Number: 5,619,017
[45] Date of Patent: *Apr. 8, 1997

[54] MICROELECTRONIC BONDING WITH LEAD MOTION

[75] Inventors: Thomas H. Distefano, Monte Sereno; Zlata Kovac, Los Gatos; John Grange, Cupertino, all of Calif.

[73] Assignee: Tessera, Inc., San Jose, Calif.

[ * ] Notice: The term of this patent shall not extend beyond the expiration date of Pat. No. 5,491,302.

[21] Appl. No.: 551,458

[22] Filed: Nov. 1, 1995

Related U.S. Application Data

[63] Continuation of Ser. No. 308,741, Sep. 19, 1994, Pat. No. 5,491,302.
[51] Int. Cl.⁶ ...................................................... H05K 1/14
[52] U.S. Cl. .......................... 174/260; 174/261; 361/772; 361/774; 29/832; 29/835; 439/84; 439/74; 439/65
[58] Field of Search ...................................... 174/250, 260, 174/261, 262, 267; 361/760, 772, 773, 774; 29/854, 868, 877, 832, 835, 838; 439/84, 74, 68, 65

[56] References Cited

U.S. PATENT DOCUMENTS

| | | |
|---|---|---|
| 5,127,570 | 7/1992 | Steitz et al. .............................. 228/103 |
| 5,148,265 | 9/1992 | Khandros et al. ......................... 357/80 |
| 5,148,266 | 9/1992 | Khandros et al. ......................... 357/80 |
| 5,173,574 | 12/1992 | Kraus ..................................... 174/261 |
| 5,489,749 | 2/1996 | DiStefano et al. ....................... 174/261 |
| 5,491,302 | 2/1996 | Distefano et al. ....................... 174/260 |

*Primary Examiner*—Laura Thomas
*Attorney, Agent, or Firm*—Lerner, David, Littenberg, Krumholz & Mentlik

[57] ABSTRACT

A method of connecting a semiconductor chip assembly having at least first and second contacts to a connection component including at least first and second connection leads by means of a tool consisting of the steps of juxtaposing moving and connecting the leads to the corresponding contacts. The connection component is juxtaposed with the semiconductor chip assembly so that the first and second connection leads are aligned with the first and second contacts in such a manner that the first connection lead is offset from the first contact in the first direction and the second connection lead is offset from the second contact in the same first direction. The first connection lead is moved by means of the tool substantially downwardly and towards the first contact in a second direction which is opposite to the first direction, so that an open space is formed between the first connection lead and the second contact and lead to facilitate movement of the second connection lead by the tool substantially downwardly and towards the second contact in the second direction.

4 Claims, 9 Drawing Sheets

MICROELECTRONIC BONDING WITH LEAD MOTION

This is a continuation, of application Ser. No. 08/308,741 filed Sep. 19, 1994 now U.S. Pat. No. 5,491,302.

FIELD OF THE INVENTION

The present invention relates to methods of mounting and connecting microelectronic devices and, more particularly, it relates to the method of connecting microelectronic parts such as semiconductor chips to external circuitry and the like.

BACKGROUND OF THE INVENTION

Rapid development of a semiconductor industry in recent years has created a continued demand for progressively greater numbers of contacts and leads in a specific amount of space. An individual chip may require a substantial number of contacts, all within the area of the chip surface. For instance, a complex semiconductor chip in current practice may have rows of contacts along the edges. The contacts in each such row are spaced apart from one another at center-to-center distances of 0.1 mm or less and, in some cases, 0.07 mm or less. These distances are expected to decrease progressively with continued development in the field of semiconductor fabrication.

Each contact on the chip must be connected to external circuitry, such as the circuitry of a supporting substrate or circuit panel. Prefabricated arrays of leads or discrete wires are typically employed for making such interconnections. With such closely-spaced contacts, the leads connected to the chip contacts, must be extremely fine structures, typically less than 0.035 mm wide. Such fine structures are susceptible to damage and deformation. With closely spaced contacts, even minor deviation of a lead from its normal position will result in misalignment of the leads and contacts. Thus, a given lead may be out of alignment with the proper contact on the chip or substrate, or else it may be erroneously aligned with an adjacent contact. Either condition will yield a defective chip assembly. Errors of this nature materially reduce the yield of good devices and introduce defects into the product stream. These problems are particularly acute with those chips having relatively fine contact spacings and small distances between adjacent contacts.

Various approaches have been taken towards development of technological processes, tools and the like designed to a accommodate high concentration of contacts and leads as well as extremely fine nature of the components involved in these manufacturing operations. For example, commonly assigned U.S. patent application Ser. No. 919,772 filed Jul. 24, 1992 (the disclosure of which is hereby incorporated by reference) provides a semiconductor connection component and method which quite successfully deal with the above-mentioned problems by providing a connection component having a gap with, in some cases, one or more leads having elongated connection sections extending across such gap. The connection component is disposed on the chip or other part to be connected so that the connection sections of the leads extend above the contacts of the chip. During the bonding operation such connection sections are displaced relative to the connection component and engaged with the contacts. In certain preferred embodiments of these novel methods, prior to the bonding operation, the connection sections are situated substantially parallel to each other in a row and aligned with the corresponding contacts of the semiconductor chip. This system allows a bonding tool to engage and bond each connection section in sequence. However, as the center-to-center distance between contacts on the chip, and hence the center-to-center distance between adjacent lead connection sections decrease, this system encounters a limit. At extremely small center to center distances, it does not provide enough space to accommodate a shank of the tool during the bonding operation. As the tool moves a connection section downwardly to engage it with the corresponding contact, the shank of the tool may interfere with the next adjacent unbonded connection section in the row. As further explained below, such interference can be caused or aggravated by attempts to compensate for lead misalignment and by the shape of the tool shank. Thus, there has been a considerable need for a process and a connection component which alleviate these concerns and which permit use of the as above process at even smaller contact center-to-center distances.

Typically, the lead includes a connection section having a first end fixed to the body of the connection component and having a second end detachably connected to the body by a frangible section of the lead. The frangible section breaks during downward movement of the tool. As further described in copending, commonly assigned U.S. patent application Ser. No. 096,693 (the disclosure of which is hereby incorporated by reference herein), the tool used in bonding the connection sections of the leads desirably moves in the longitudinal direction of the lead connection section. The longitudinal movement is normally away from the frangible section of the lead and toward the fixed or first end, i.e., toward the end which remains attached to the connection component body. This movement tends to bend the lead, typically into an S-shaped configuration prior to bonding. It effectively relieves stress in the lead induced by the downward movement of the tool.

During this longitudinal movement, the bond region of the lead engaged with the tool should move along with the tool along with the tool. If tool allowing the tool to move lengthwise along the lead, the S-shaped configuration may not be achieved. Thus, further improvement in this aspect of the bonding operation is also desirable.

SUMMARY OF THE INVENTION

One aspect of the present invention provides a method of connecting a part of a semiconductor chip or other microelectronic assembly having a plurality of contacts disposed in a row to a connection component including a plurality of leads having connection sections disposed side by side in said row. The method comprises the steps of juxtaposing the connection component with the part of the semiconductor chip assembly and connecting the connection section to the corresponding contacts. In the step of juxtaposing the row of connection sections is disposed above the row of contacts in alignment therewith, so that each connection section is offset from a corresponding contact in a first direction along said rows. In the connecting step, the connection sections and the corresponding contacts are connected by performing a connection cycle on the connection sections in sequence along the row in the first direction. Each connection cycle for each connection section includes the step of engaging one or more connections section with a tool and moving the engaged section or sections and the tool downwardly and in a second direction opposite to said first direction into engagement with the corresponding contacts, whereby during each connection cycle the tool and the engaged connection section or sections move away from the next adjacent unconnected connection section. Because the tool moves away from the next unconnected connection section, there is increased clearance for the tool shank.

The method may further include the step of determining the amount and direction of deviation from nominal positional relationship between the connection sections of the leads and the contacts. Such determination can be made by machine-vision systems, either for each individual connection section or, more typically, for an entire row of connection sections, as by determining the deviation from nominal positional relationship between fiducial marks on the connection component body and fiducial marks on the chip or other microelectronic component using an automated vision system. The method may further include the step of varying the amount of movement of the tool in the second direction so as to compensate for such deviations. Such variation most preferably does not decrease the amount of tool movement in the second direction to zero even with maximum deviation from nominal positioning. Stated another way, the nominal offset of the lead connection sections from the contacts in the first direction should be greater than the maximum deviation from nominal positioning in the second direction. Thus, even after compensation for deviation, the tool will always move in the second direction, away from the next unbonded lead. By contrast, attempts to compensate for deviation from nominal positioning without nominal offset would require tool movement in the first direction, toward the next unbonded lead, in some cases, and thus would tend to cause interference between the tool and unbonded lead.

Preferably, the connection component includes a body having top and bottom surfaces and a gap or window extending through the connection component body, between the top and bottom surfaces. Each lead hay have a connection section extending across the gap and may have first and second ends secured to the connection component body on opposite sides of the gap. The second end of each connection section desirably is secured to the body so that the second end can be displaced substantially downwardly relative to the body responsive to the force applied to the lead. In this arrangement, the connection section of each lead is supported at both ends by the connection component before the moving step. The connection section of each lead is bent downwardly during the connection step to engage the corresponding contact.

A further aspect of the invention provides additional methods of connecting a parts of microelectronic assemblies such as chips to connection components including plural leads. The connection component used in a method according to this aspect of the invention desirably includes a plurality of leads, each such lead having an elongated connection section. Each connection section has at least one projection extending outwardly from the lead and forming a stopping portion adapted for engagement with the bonding tool to stop longitudinal motion of the tool along the connection lead. The projection can extend outwardly either from a top surface or from an exterior edge of the connection lead.

Alternatively, the connection lead can be provided with a pair of projections extending outwardly and symmetrically from the Opposite exterior edges of the lead to define a stopping portion adapted for engagement with the bonding tool. Each projection is typically formed by at least an engaging edge facing the tool and a rear edge. The engaging edge is typically positioned to the exterior edge of the lead at an angle of about 90', whereas the rear edge is typically interposed to the exterior edge at an angle between 120' and 150'.

Typically, in the connecting step each connection section is engaged by a bonding tool and at the tool is moved so that least part of the connection section is displaced relative to the body of the connection section. In preferred methods according to this aspect of the invention, the tool movement includes in the longitudinal direction of the lead connection section. The projection or projections on each connection section are engaged by the tool during this motion, so that the engaged region of the connection section moves longitudinally with the tool. A first end of the connection section typically remains attached to the body of the connection component, and the tool is moved longitudinally toward the first end so as to deform the connection section into an S-shaped curve. During this action, the projection prevents longitudinal slippage of the tool relative to the connection section. The movement of the tool preferably also displaces a second end of each connection section relative to the body of the connection component. Typically, the second end of each connection section is detached from the connection component body during the displacement in the substantially downward direction, as by breaking a frangible portion of each lead so as to separate the second end of each connection section from the connection component body by forcing the connection section substantially downwardly within the component.

Yet another aspect of the invention provides a connection component including leads. Each lead preferably has at least one projection extending outwardly from its body. The projection can extend outwardly either from a top surface or exterior edge of the connection lead. According to a further aspect of the invention, each connection lead is provided with a pair of projections extending outwardly from the opposite exterior edges. Preferably, each projection is formed by at least an engaging edge and a rear edge, wherein the engaging edge is positioned to the exterior edge of the lead at an angle of about 90' and the rear edge is interposed to the exterior edge at an angle between 100' and 150'.

Each lead may incorporate a frangible element positioned adjacent to the second end thereof. Each frangible element may be include one notch, or a notches extending substantially inwardly from the exterior edges of the lead to define a neck having width which is substantially smaller than the width between the exterior edges.

A further aspect of the invention provides a connection component having a body and having elongated leads, each including an anchor section on the body and a connection section extending from the anchor section, across an edge of the body. For example, each connection section may extend across an exterior edge of the body and away from the body. Alternatively, each connection section may extend across an edge of the body defining a gap or window as discussed above. Each lead has a tapered section extending longitudinally in the vicinity of the edge, so that the moment of inertia of the lead in bending in transverse to the edge decreases progressively in the longitudinal direction away from the edge. In use, a bond region of each connection section is displaced downwardly and preferably displaced in other directions as well, as discussed above. The tapered section causes the lead to bend into a smooth curve, instead of kinking at the edge. This enhances the ability of the lead to resist fatigue and thermal cycling.

BRIEF DESCRIPTION OF THE DRAWINGS

Other advantages and features of the invention are described with reference to exemplary embodiments, which are intended to explain and not to limit the invention, and are illustrated in the drawings in which.

DETAILED DESCRIPTION OF THE INVENTION

Although specific embodiments of the invention will now be described with reference to the drawings, it should be understood that the embodiments shown are by way of examples only and merely illustrative of but few of many possible specific embodiments which represent application of the principles of the invention. Various changes and modifications obvious to one skilled in the art to which the invention pertain are deemed to be within the spirit, scope and contemplation of the invention as further defined in the appended claims.

The invention shall be best interpreted with understanding that the terms."top" and "bottom" as well as the terms "upwardly" and "downwardly" are used herein to indicate only directions relative to the assembly and should not be referred to the gravitational frame of reference.

Figure 1:
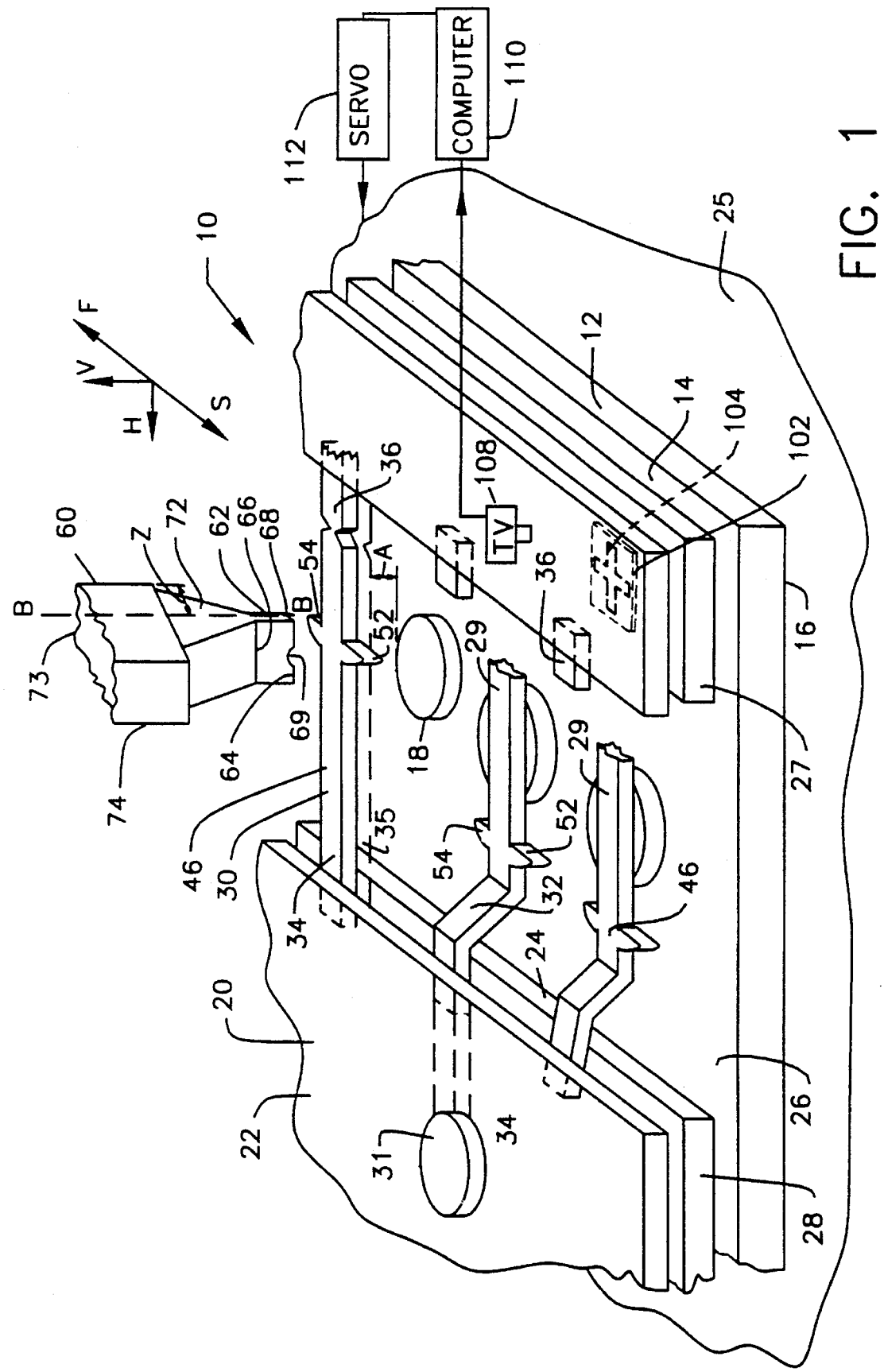
FIG. 1 is a semiperspective view illustrating connection between a semiconductor chip assembly and a connection component according to the present invention.
Figure 2:
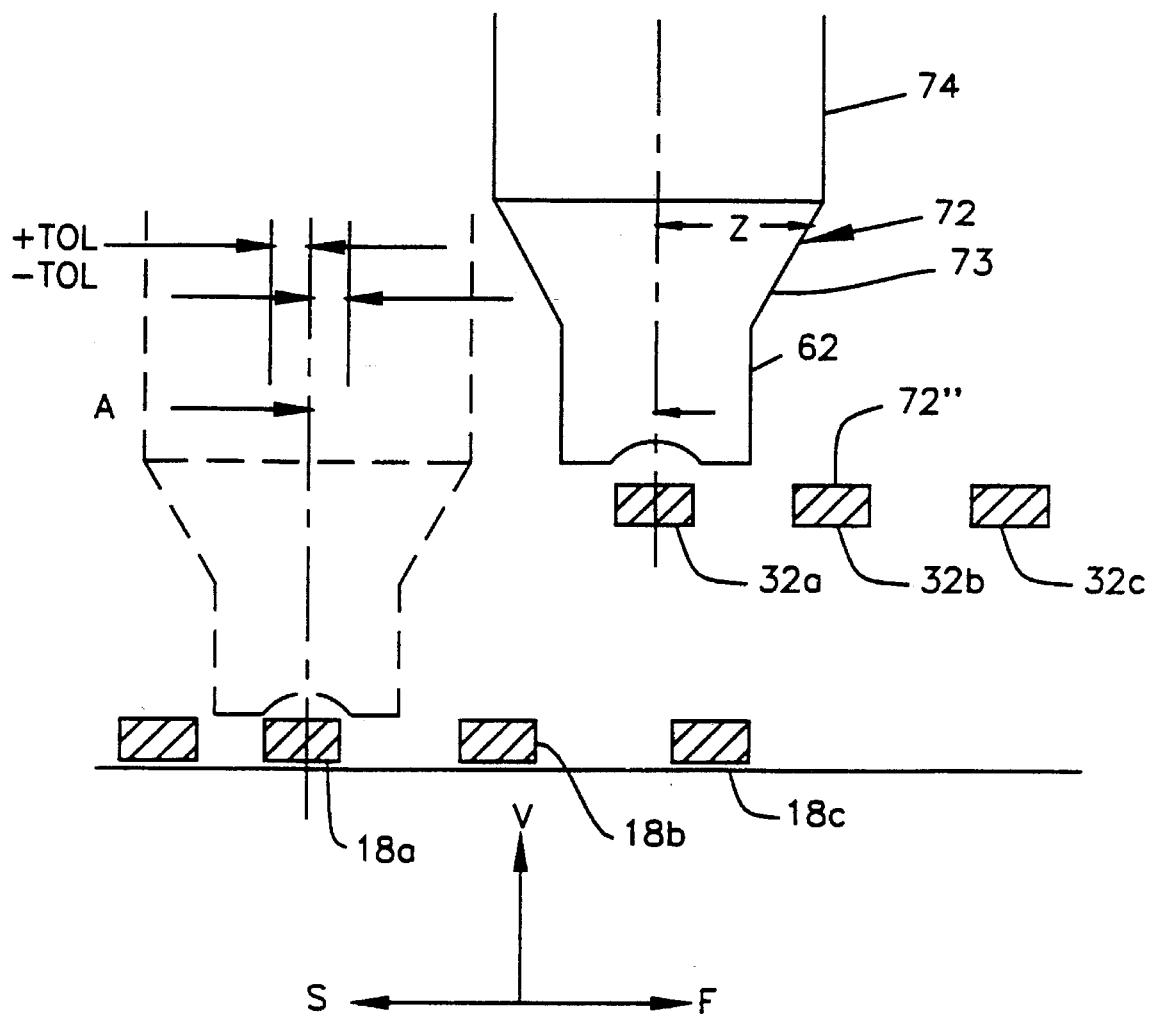
FIG. 2 is a side elevational view showing a bonding process of the invention.

An assembly 10 according to one embodiment of the invention is best illustrated in FIGS. 1 and 2 and includes a semiconductor chip 12 and a connection component 20. The conventional semiconductor chip 12 is typically made as a solid body having top 14 and bottom 16 surfaces as well as at least one row of electrical contacts or connection pads 18, typically situated adjacent an outside periphery of the chip. The chip also has a plurality of fiducial marks 104 on its top surface, in predetermined locations relative to the contacts 18.

A connection component 20 is formed having a top, dielectric layer 22 made of a thin, flexible film of dielectric material such as polyimide and a bottom layer 24 formed from a relatively soft compliant material such as an elastomer or a gel, or from a composite structure including a liquid material. The top and bottom layers constitute a connection component body or support structure. The support structure has at least one elongated window or gap 26 extending through both layers and separating the support structure into a central portion 28 and an outer portion 27. Electrically conductive terminals 31, of which only one is visible in FIG. 1, are situated within the central portion of the support structure. Each terminal is connected to an electrically conductive metallic connection lead 30. Each lead is provided with an elongated, strip-like connection section 32 extending across the gap. The connection sections extend side-by-side across the gap 26. The connection component has fiducial marks 102 on its body in predetermined locations relative to the leads.

The connection section of each lead has a first or proximal end 34 attached to the central portion 28 and a second or distal end 36 releasably connected to the outer portion 27 of the support structure. The second end 36 of the connection section is secured to the outer portion 27 of the support structure by a frangible element or a frangible section 38. Each frangible section connects the second end of the connection section to the outer portion. The leads are typically formed from one or more malleable metals such as gold, copper or composite structures including both gold and copper. As best shown in FIGS. 1–4, each frangible section or element of each lead is formed by a pair of notches 37 and 39 extending substantially inwardly from exterior edges 40 and 42 of the lead to define a neck. Such neck has width which is substantially smaller than the width of the connection lead between the exterior edges thereof. The included angle defined by the surfaces of each notch desirably is about 120 to about 150 degrees, and more preferably about 135 to about 150 degrees. Also, the size of the notches is controlled so that the width at the frangible section is about 0.5 times the width of the lead itself in the bond region.

Figure 8:
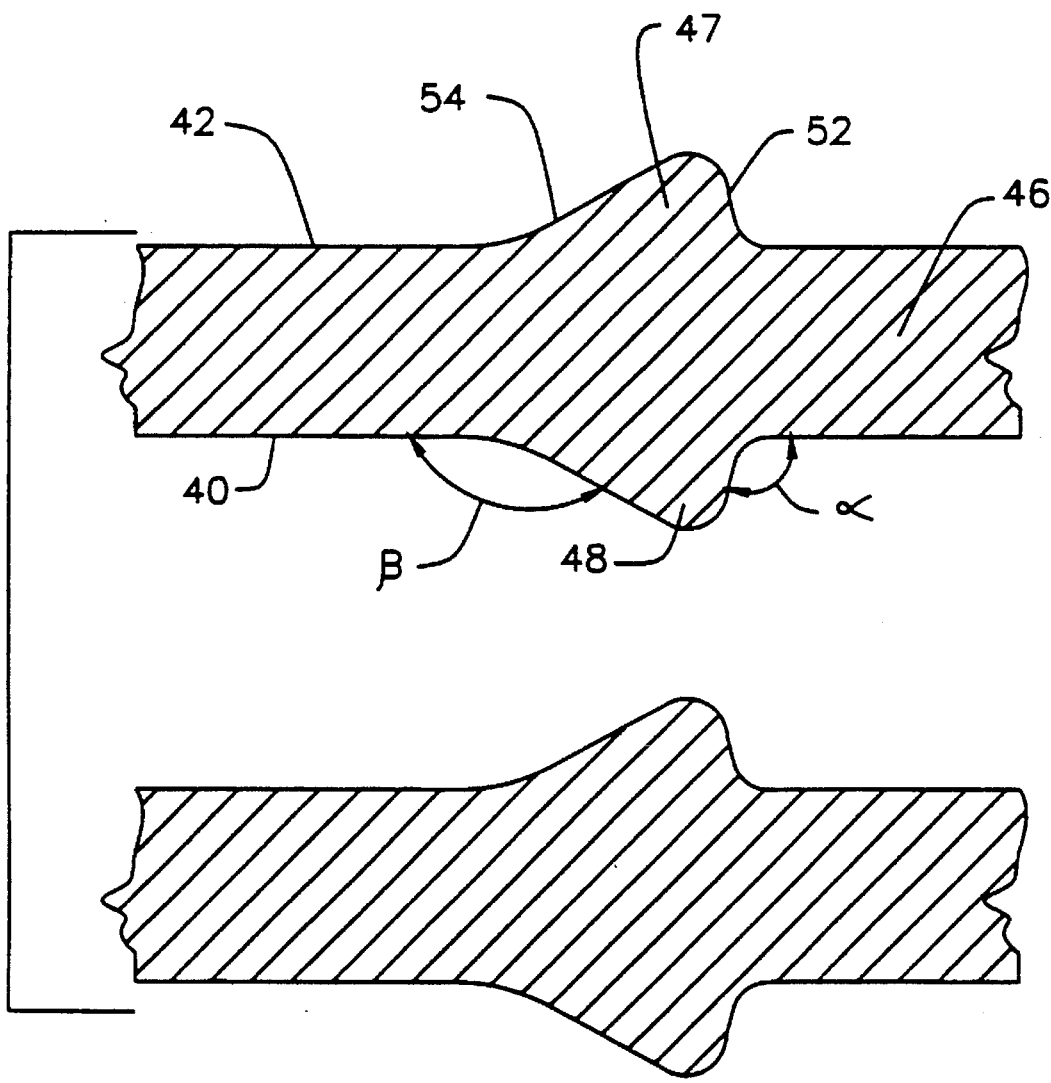
FIG. 8 shows a partial top plan view of two connection leads having the projections.

Each connection lead is further provided with a bond region 29 positioned adjacent the second end of the connection section and the frangible section thereof. At least one projection extends outwardly from a body of each connection lead forming a stopping portion 46. As discussed hereinbelow, these stopping portions are adapted for engagement with a bonding tool for restricting and/or stopping longitudinal motion of the tool relative to the lead. In the embodiment of FIGS. 1–4 the stopping portion 46 of each connection lead includes a pair of projections 47 and 48 extending outwardly and symmetrically from opposite exterior edges of the elongated connection section. Each projection is formed by at least an engaging wall 52 facing toward the outer portion 27 and the rear wall 54 facing toward the outer portion 28. FIG. 8 shows that the engaging wall of projections 17 and 48 are positioned at angles of a about 90' degrees to the exterior edge of the lead, whereas the rear wall is interposed to the exterior edge of the lead at an angle B between 120' and 150'.

In a method according to one embodiment of the invention, the semiconductor chip is initially disposed on a substrate or a flat support surface 25. Then, the connection component 20 is positioned atop the chip 12 (see FIG. 1) with the bottom layer 24 of the connection component facing the top surface 14 of the chip. The connection component is juxtaposed with the chip in such a manner that the gap 26 of the connection component is aligned with the row of contacts 18 of the chip. Thus, a longitudinal axis of the gap 26, coincides with or extends substantially parallel to the lengthwise axis of the row of contacts or connection pads 18. The connection section of each lead is positioned across the gap 26 extending transversely to the lengthwise axis of the row of contacts. The juxtaposing step may be performed using conventional positioning elements of the type commonly employed for positioning semiconductor chips with respect to TAB (tape automated bonding) tape. The positioning equipment includes one or more video cameras 108, computer equipment 110 and servomechanisms 112. During the juxtaposing step, the video camera and computer equipment detect the positions of the fiducial marks 102 and 104 on the connection component body and chip, and may also command the servomechanism to adjust the relative positions of the connection component and chip accordingly so as to bring the connection component and chip to the desired alignment. Even with such corrections, however, it is not normally possible to bring all portions of the connection component body into perfect alignment with the associated parts of the chip.

Figure 4:
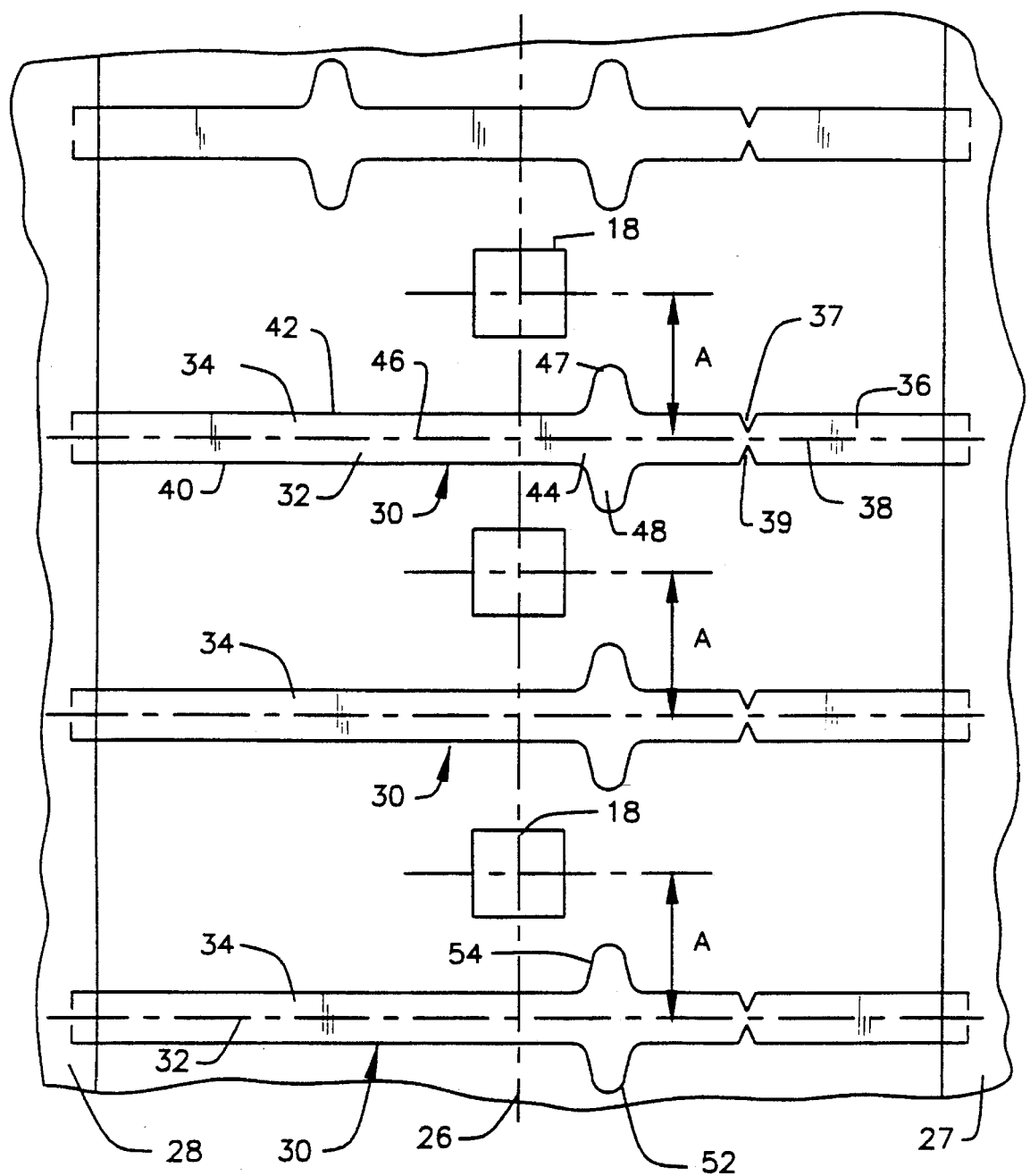
FIG. 4 is a top plan view showing the semiconductor chip and the connection element in the initial juxtaposed condition.

As best illustrated in FIGS. 1 and 4, in the juxtaposed condition of the assembly, the connection section of each lead is situated with reference to the corresponding contact in such a manner that a vertical projection 35 of such connection section on the top surface 14 of the chip is offset from the corresponding contact in a first direction indicated by the vector F in diagram parts of FIGS. 1, 2 and 4. This is clearly visible in the three-dimensional FIG. 1 with reference to the connection lead 30 and the associated contact 18. In FIG. 4 which is the two-dimensional top plan view of the parts in juxtaposed condition, each such offset appears as a space between the center line of the connection section itself and the center line of the corresponding contact. The offset in the first direction F is in a direction along the row of connection sections, i.e. a direction transverse to the longitudinal direction of each connection section Thus, prior to placement of the tool 50 into engagement with a first connection lead of the connection component, there is a predetermined distance in the first direction A between the centerline of each contact 18 of the semiconductor chip and the centerline of the corresponding connection section 32. The nominal value of predetermined offset or space A is selected according to consideration including the dimensions of the outside periphery of a shank or upper part of the tool 50 used in the bonding process and specifically it depends upon the width of the upper position. Thus, the wider the upper part of the tool is, the bigger the offset or the space should be. Also, the offset A should be at least as large, and preferably larger, than the maximum deviation from the nominal value which can be introduced by tolerances in the components and in the positioning step.

Figure 5:
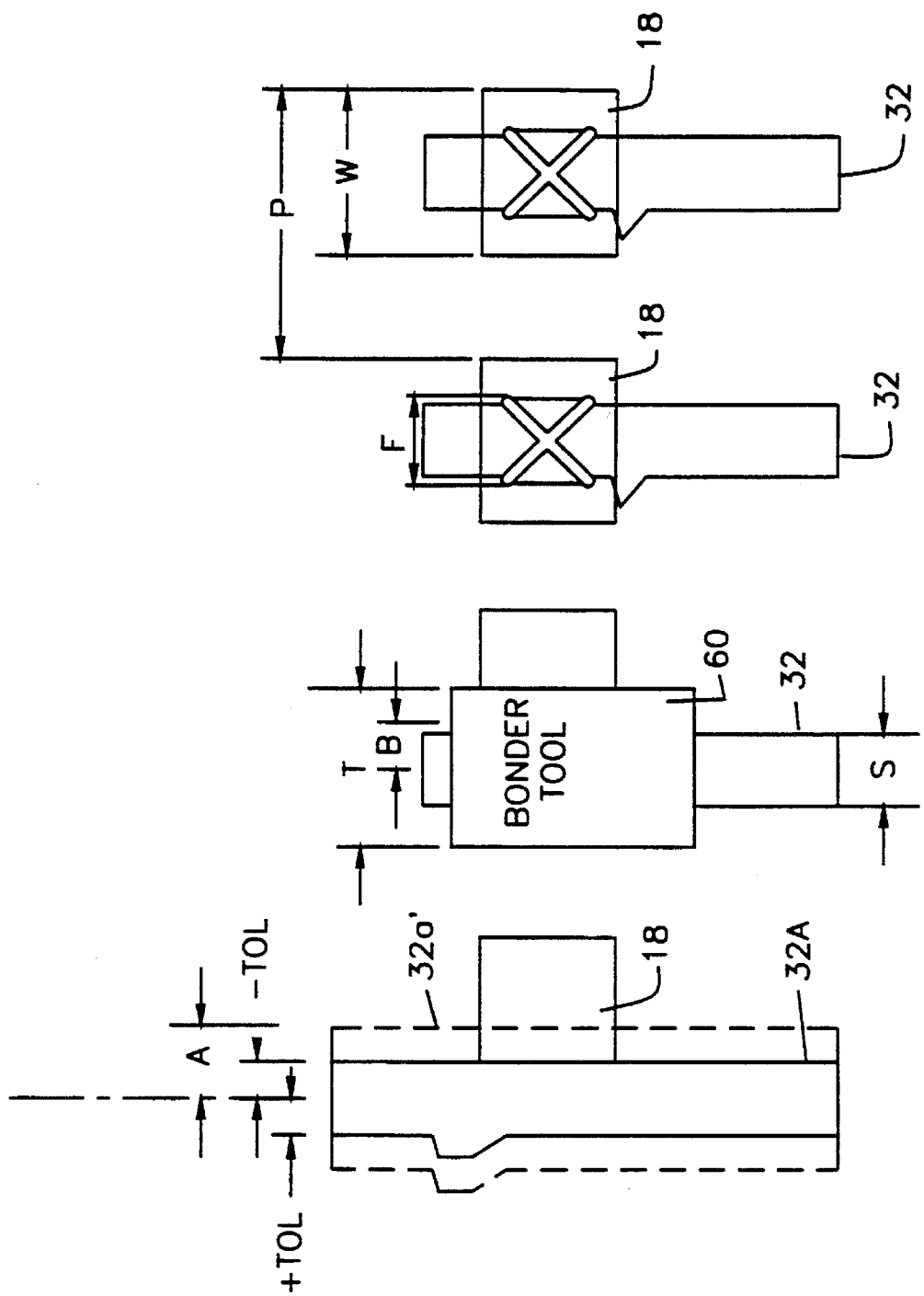
FIG. 5 illustrates correspondence between the elements of the invention during the bonding process.

In this respect, Tables I and II reflects the preferred dimensions for the connection leads or their connection sections 32, the contacts 18 and the bonding tool 60 during the process of the invention illustrated in FIG. 5. In FIG. 5, the lead connection section 32a is shown at it nominal position in solid lines and at positions affected by deviations from nominal in broken lines. Position 32a' shows a negative deviation ("−tol.") from the nominal amount of offset A, whereas position 32a" shows the effect of positive deviation ("+tol.") or greater-than-nominal offset. As indicated in table II, the nominal offset A is equal in magnitude to the maximum negative deviation (−tol.) from nominal, so that the actual offset is never less than zero. Stated another way, the actual offset value is always zero or above; the connection section of the lead is always offset in the first direction from the contact pad or, in a rare maximum-tolerance situation, (zero actual offset), the connection section may be aligned with the contact pad. Negative actual offset or offset in the second direction S opposite to the first direction does not occur in any in-tolerance assembly. In this regard, the nominal value of offset referred to herein is the mean offset which is achieved in the process over many units, regardless of the notation employed. In some dimensioning systems, a nominal offset and a range of actual offsets can be noted as an assymetrical tolerance with no explicit nominal offset, as, for example, "0 +50 microns, −0". Such an assymetrical tolerance nonetheless implicitly includes a non-zero nominal value at least equal to the maximum deviation.

The automatic vision system determines the actual offset for the various leads. After the connection component has been assembled to the chip, the computer 110 of the vision system calculates offset values for each row of leads based upon the actual positions of the fiducial marks 104 on the connection component relative to the fiducial marks 102 on the chip. Where one set of fiducial marks is disposed adjacent to a row of contacts and leads, the deviation from nominal relative positioning of the connection component mark in that set can be taken as the deviation from nominal relative positioning for all leads in the row. Thus, if the connection component mark 104 is displaced 3 microns in the first direction F from its nominal position relative to the associated mark 102 on the chip, the system assumes that each connection section likewise deviates 3 microns in the same direction from its nominal position, and therefore the actual offset for all of the connection sections is 3 microns greater than nominal. Other rows of leads, adjacent to other fiducial mark pairs, may have different deviations.

Positioning of the connection section relative to the contact on the chip in the elongation direction is substantially less critical. In view of the elongated nature of the connection sections, each section may be displaced from its nominal position by a considerable amount, up to about one-half of the length of the connection section, while still leaving a portion of the connection section in an appropriate position for engagement with the corresponding contact.

Once the connection component 20 and the semiconductor chip 12 are juxtaposed as discussed hereinabove and illustrated in FIGS. 1 and 4, the tool 50 is advanced substantially downwardly so as to effectuate engagement with the bond region of the connection section of one of the leads.

The tool may be a semiconductor inner lead bonding tool as described in commonly assigned copending U.S. patent application Ser. No. 096,700 filed Jul. 23, 1993, the disclosure of which is hereby incorporated by reference.

The tool 60 (see FIG. 1) is provided with a body 62 extending between a lower end 64 and an upper end 66. A groove 68 is formed in the lower end 64 and extends inwardly within the body. The groove is adapted to receive and engage the connection section 32 to be bonded. As described in said '700 application, the tool may also have a groove 69 extending transverse to groove 68, for use with other lead. A shank or an upper part 72 of the tool extends upwardly from the upper part of the body 62. The shank typically includes a connecting portion and shoulder 74 at its upper end, remote from the body 62. These features are adapted to mate with the tool holder of a bonding apparatus (not shown) so that the tool may be held in operative position on the apparatus, so that force and energy generated by the apparatus may be directed through the tool as discussed hereinbelow.

It is illustrated in FIG. 1 that the shank or upper part of the tool 72 has a pyramidal shape configuration. The shank substantially widens from its lower part located at its juncture with the body 62 to an upper end situated near the shoulder 74, so that the outer dimensions of the upper part of the shank are substantially greater than that of the lower part thereof. The shank typically 62 has uniform dimensions in a straight section about 0.3–0.4 mm (about 8–10 mils) long at its bottom end. In the next section above the straight section, the depth dimension Z of the shank from the center line vertically aligned with the groove 68 to the face 73 in the first direction F increases towards the upper end of the shank. This tapering configuration provides the shank with sufficient strength for the bonding operation. However, such shape of the shank requires an extra space, especially when the tool moves downwardly as discussed hereinbelow.

Although, in FIG. 1, the shank 72 is shown sloping in both directions from the vertical axis of the tool B-B, a tool with a shank having one or more sides positioned substantially parallel to this vertical axis is within the scope of the invention. Thus, the tool may have a vertical side facing in the first direction F (the direction toward the unbonded leads in the row) and may have sloping sides facing in the other directions. The exact configuration of the tool including its shank will vary with the design of the particular bonding apparatus and the nature of the elements to be bonded.

In the bonding operation, the tool 60 is advanced downwardly (in the direction opposite to the direction of the vector V in the diagram part of FIG. 1), so as to engage and force the connection section of the lead downwardly.

The force generated as a result of this downward motion of the tool 60 is applied to the bond region 39 of the connection section. As the tool moves further downwardly, frangible element 38 breaks, disconnecting the second end 36 of the connection section from the outer portion 27 of the support structure. However, the first end 34 is still connected to the central part of the support structure. In this condition, the vertical motion of the tool 50 tends to move the bond region 39 of the connection lead substantially downwardly towards the top surface 14 of the chip. Simultaneously, the tool 60 is also being moved substantially horizontally, in the longitudinal direction of the lead, towards the first end 34 of the connection section. At the same time, the tool and the engaged portions of the lead move sidewise in the direction of the corresponding connection contact or pad 18. In the diagram part of FIG. 1, the horizontal longitudinal component of the tool motion is indicated by vector H, whereas the vertical component of the motion is represented by vector V. The sideways component of motion is in the second direction S along the row, i.e., opposite to the first or offset direction F.

The sidewise component of the tool motion for each lead is equal in magnitude, to the actual offset of that lead from the corresponding contact, as previously calculated by the vision system. Thus, the sidewise motion of the tool is sufficient to shift the connection section in the direction of the corresponding contact pad 18. Stated another way, the tool and the engaged lead move in a second horizontal direction, (indicated by the vector S) opposite to the first or offset direction (indicated by the vector F).

As best be appreciated with reference to FIG. 2, this sideways component of motion provides misalignment compensation without causing interference between the tool and the unbonded leads. After the tool 60 initially engages lead connection section 32a, the tool and lead will move in the second direction S, away from the next adjacent unbonded connection section 32b. The nominal magnitude of this motion is the nominal offset A. Deviations from nominal offset(±tol) will cause the system to increase or decrease the magnitude of the second direction motion, but will never cause opposite, first-direction motion of the tool. By contrast, if the system is arranged to provide sideways tool motion so as to compensate for deviations from nominal positioning, but with no nominal offset (A=0), then negative (second direction) deviation of the lead from nominal positioning would require that the tool move in the first direction, toward the next adjacent unbonded connection section. Such an arrangement requires larger spaces between adjacent leads.

The second-direction motion also helps to provide clearance for the shank. As the tool 60 initially engages the connection section of a lead, its wide shoulder 74 disposed above the plane of the intact connection sections 30a, 30b, and 30c which have not yet been connected, as shown in solid lines. However, as the tool continues its downward motion bringing the engaged connection section 30a toward the chip contacts the shank descends towards the unconnected connection sections 30b, 30c, etc. The sideways movement in the second direction S moves the tool, and hence shank 72, away from the next adjacent unconnected connection section 30b while also bringing the tool into alignment with the corresponding chip contact 18a. Thus, the tool and shank move to the position indicated in broken lines at 72', leaving the shank clear of connection section 30b. By contrast, if the operation were attempted without the sideways motion, the tool and shank would move to a position as shown at 72", in which the shank would interfere with the next connection section 30b.

During the vertical and sideways motion, the tool also moves horizontally in the direction of the vector H in a lengthwise direction of the lead toward its first end 34. If frictional and mechanical engagement between the connection section and the tool is weak, the tool may initially slide longitudinally along the connection section. However, as the tool 60 approaches the bond region, any further sliding motion along the connection lead is prevented by the stopping portion 46. Since the outer periphery of the projections 47 and 48 is substantially wider than the groove of the bonding tool, the projections stop the tool from sliding along the connection section and block motion of the tool relative to the lead. Therefore, in the following part of the horizontal, lengthwise component of the motion, the tool and the connection section are combined as one unit.

The lengthwise component of motion should be sufficient to counteract any increase in the distance between the first end of the connection section and the bond region caused by breaking of the frangible element and the downward motion. The horizontal movement sufficient enough to bend the connection section of lead in a generally S-shaped configuration. The distance along the lead in its bent condition between the first end of the connection section and the bond region is greater than the length of a straight line connecting the first end to the bond region. Stated another way, the lead is not under tension during with the bonding process. During the horizontal component of motion there is tendency for the lead to form or be transformed into a generally S-shaped element, with the portions adjacent first end 34 and bond region 39 being nearly horizontal, and with intervening portion being curved. The S-shaped bend resulting from an extra length of the connection section helps to assure a reliable connection between the terminal area of the connection component and the contacts of the chip. Since the S-shaped bend is formed upon application of the tool 50 to the connection section during the bonding procedure, reliability of this step of the method of the present invention depends upon the quality of engagement between the lead and the bonding tool. The stopping section having projections extending outwardly from the sides of the lead enhances the quality of engagement and improves the quality of lead forming procedure. By providing a more reliable engagement between the lead and the bonding tool, the stopping portion enhances the ability of the tool to manipulate the lead and improves the efficiency of its horizontal motion and S-shaped formation function.

Heat and/or ultrasonic vibrations are employed by the bonding apparatus so as to cause the lead to bond to the contact. Upon forming a reliable bond between one connection lead and the corresponding contact or contact, the bonding tool 50 is retracted substantially upwardly and advanced along the direction of the axis of the groove or the contact row. Then, the bonding tool 50 is again brought down into engagement with the next unformed and unbonded lead situated in its initial position offset from the associated contact. In this movement, the open space formed between the previously bonded lead and currently used lead and pad facilitates movements of the tool and its wide upper part at least in the vertical and sidewise directions. The tool and the currently bonded lead can be manipulated without damaging the previously bonded lead or contacting the next adjacent unbonded lead. Thus, the connection cycle is repeated for successive leads along the row in the first direction F. As the manufacturing operation continues on successive cycles, the open space propagates down a row of bonds as they are formed, resembling in appearance a zipper-like element.

Figure 6:
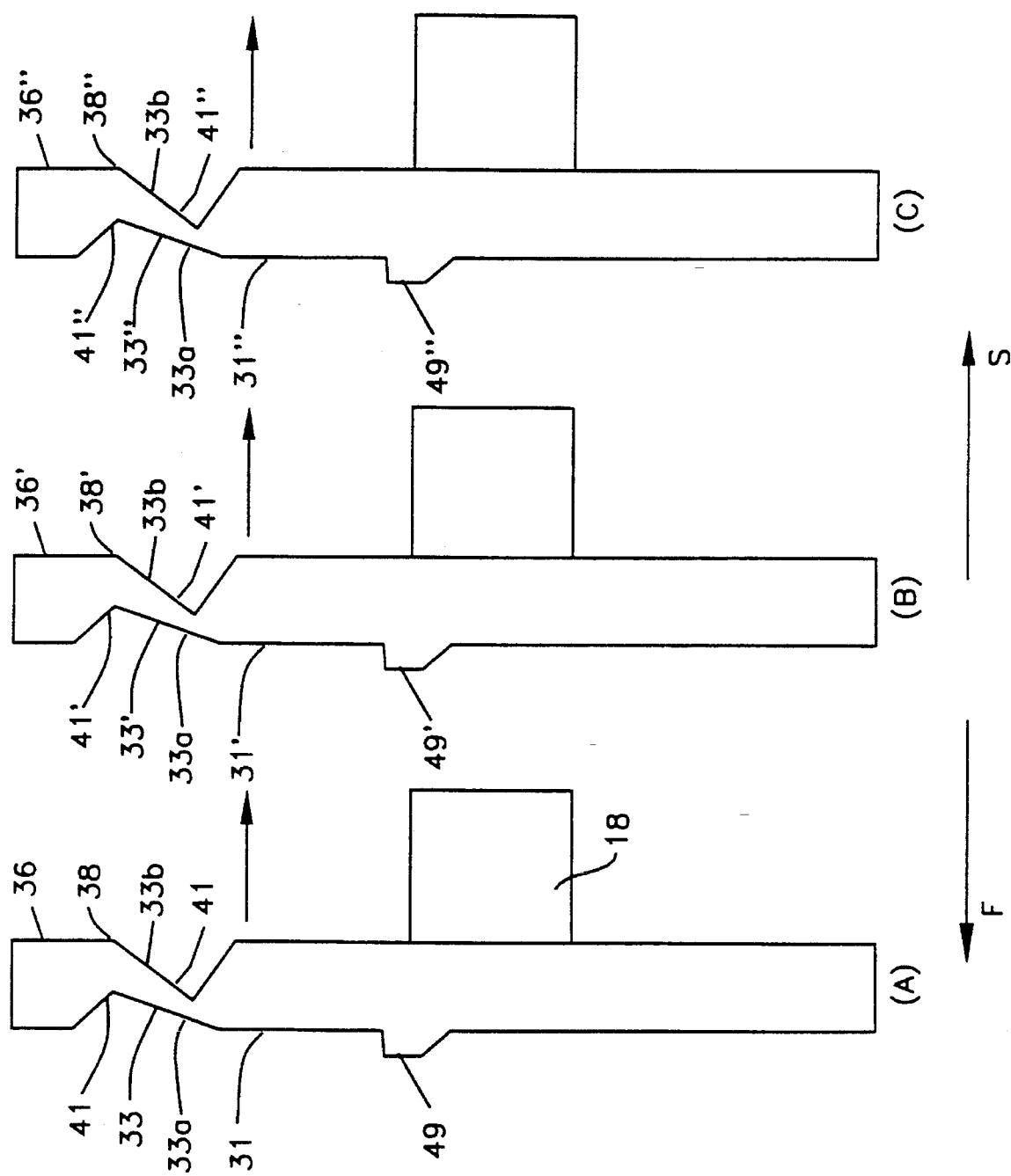
FIG. 6 illustrates different embodiments of the frangible portion of the connection lead.
Figure 7:
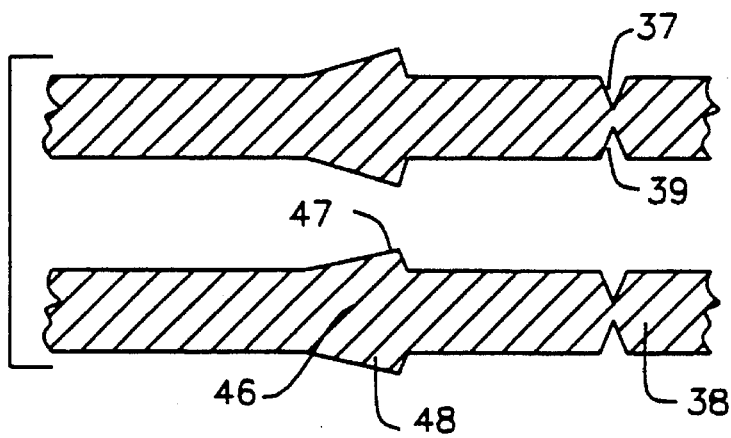
FIG. 7 shows a top plan view of a pair of connection leads of the invention having frangible elements and projections.

Different types of the frangible portions of the connection sections are illustrated in FIG. 6. Prior to the bonding operation the frangible section 38 connects the second end 36 of the connection section with the second end securement section 31. Each frangible section illustrated in FIG. 6 includes a neck (33, 33' or 33") of smaller cross-sectional area than the second end securement section 31 and the second end 36 of the connection section. Each neck shown in FIG. 6, connects the second end securement section 36, 36', 36" with the second end 31, 31', 31" of the connection section. In its initial, undeformed condition illustrated, each such neck 33, 33' and 33" slopes from the connection section to the second end securement section in the second horizontal direction identified by the vector S. Such assymetrical necks facilitate movement of the connection section in the second direction S during the bonding operation. Although the present invention is not limited by any theory of operation, it is believed that the force applied by the neck pulls the connection section laterally, thus assisting the sideways motion imparted by the bonding tool. Each frangible section of FIG. 6 is formed by two notches extending inwardly within the connection section from the exterior edges thereof towards its central portion. Each notch has an apex. In the embodiment A of FIG. 6, an elongated neck 33 is bound by two sides 33(*a*) and 33(*b*) positioned to each other at an angle. The neck 33' of the embodiment B has a uniform thickness and is developed by two sides substantially parallel to each other. To facilitate etching, the apexes 40 and 41' in the embodiments A and B respectively are longitudinally spaced from each other. A relatively short neck 33" of the embodiment C is formed in such a manner that the apexes 41" are positioned in the vicinity of each other.

Figure 11:
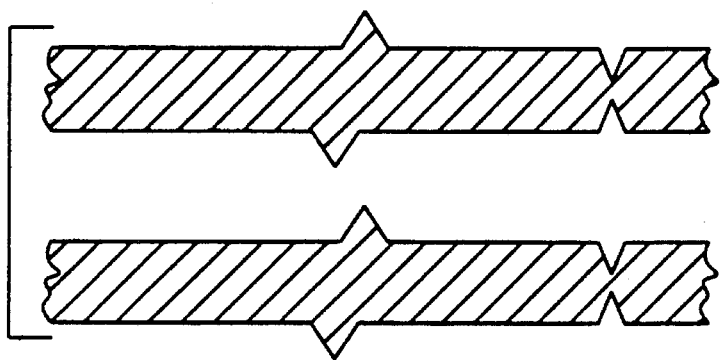
FIG. 11 shows a pair of connection leads having nested projection.

FIG. 11 illustrates the embodiment of the invention with leads having nested projections of the stopping portions which can interface without interference with each other. By nesting the projections, it is possible to pack the connection leads of the connecting component closer together without having the stopping portions of the adjacent leads affecting one another.

Figure 12:
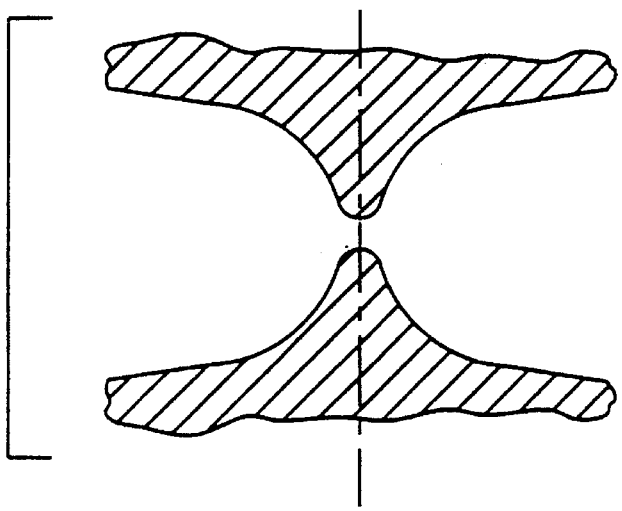
FIG. 12 shows an enlarged area between two adjacent projections.

The projections on the bonding leads need not be long and wide. As illustrated in FIG. 12, such projections can be made in the form of spur-like formations. Narrow and pointed projections can be positioned near each other and allow adjacent strips to be positioned in the close vicinity to each other. Adjacent projections should be narrow at their closest points, so that in case a plating bridge defect connecting the leads to each other, the bridging connection is fragile enough to break free upon application of the force during bonding.

Figure 10:
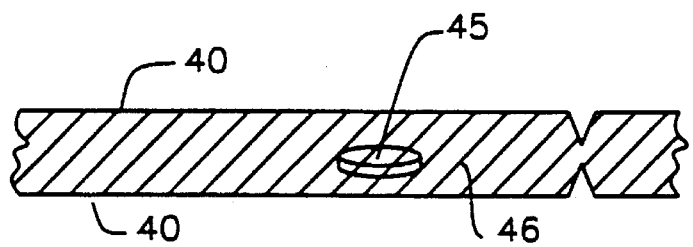
FIG. 10 shows a partial top plan view of the connection lead having the projection extending from a top surface thereof.
Figure 9:
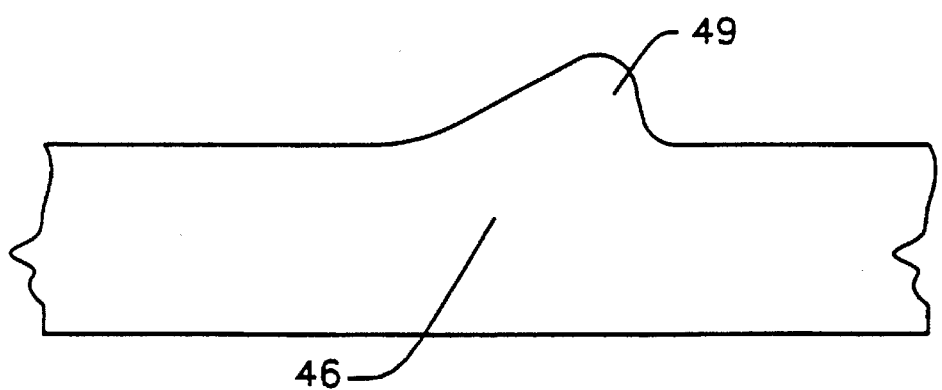
FIG. 9 shows a partial top plan view of the connection lead having one projection extending from the exterior edge thereof.

The stopping portion of the present invention can effectively operate with one projection extending outwardly from the connection section. These embodiments are shown in FIGS. 9 and 10. In FIG. 9 the single projection 49 extends in the first horizontal direction. In FIG. 10, the projection 45 of the stopping portion 46 extends substantially upwardly from the top portion of the connection section. In the embodiment of FIG. 9, the projection 49 is formed adjacent to one exterior edge of the connection section. In both instances, longitudinal sliding motion of the tool along the lead can be effectively stopped upon engagement between the groove of the tool and the projections 45 and 49.

In its motion in the second horizontal direction according to the vector S the tool 60 initially approaches the connection section of the lead to be bonded from its side furthest from the corresponding contact. To facilitate engagement between the tool and the connection section during the bonded process, the connection sections shown in FIG. 6 are provided with the stopping portions, each having one projection 49 extending in the direction opposite to the motion of the tool end leads. In such instance, the groove of the tool engages the projection 49 upon contacting the connection section.

Figure 13:
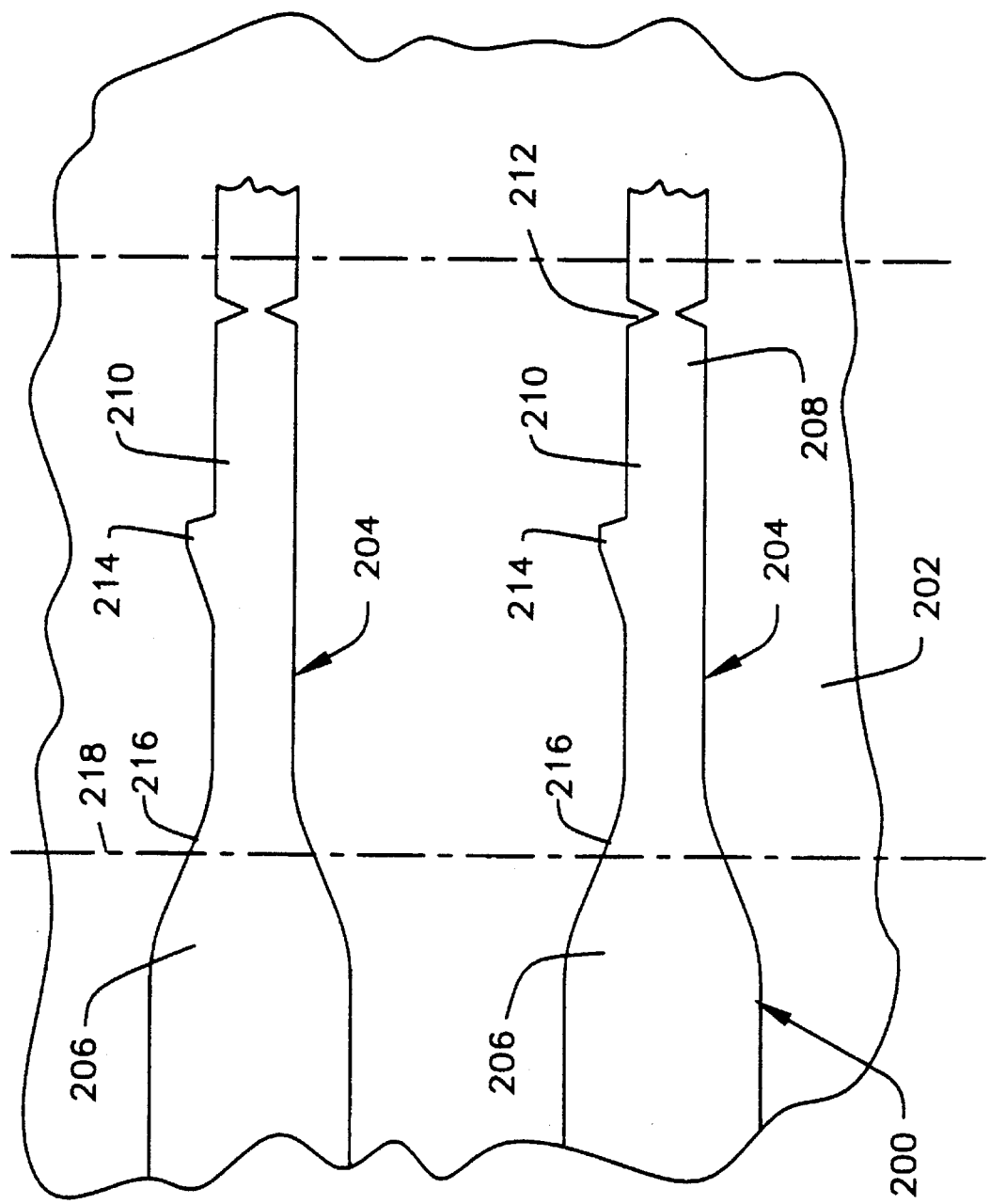
FIG. 13 shows a top plan view of another embodiment of the connection sections.

As illustrated in FIG. 13, a component according to a further embodiment includes elongated, striplike metallic leads 200 extending across a gap or window opening 202 in the body of the connection component. As in the reference discussed above, each lead has a connection section 204 extending across slot 202, the connection section having a first end 206 attached to the body on one side of the opening, a bond region 210 and a second end 208 attached on the other side. Each such second end 208 is connected to the body by a frangible section 212 as discussed above. A projection 214 protrudes from the connection section adjacent bond region 210 for arresting motion of the tool.

In the arrangement of FIG. 13, each lead incorporates a tapered section 216 adjacent the fixed or first end 206 of the connection section. The tapered section is disposed adjacent the edge 218 of the body bordering the gap or window 202 at the first end of the connection section. The width, and hence the cross-sectional area, of the tapered section decrease progressively in the direction away from edge 218 and the first end 206 of the connection section toward the second end 208 of the connection section. Also, the moment of inertia of the tapered section in bending about a horizontal neutral axis transverse to the connection section (parallel to edge 218) decreases in the same direction. Preferably, the configuration of the tapered section is selected so that the tapered section approximates a beam of uniform strength in bending with respect to vertical forces applied at the bond region 210. That is, the rate of change in the moment of inertia with lengthwise distance may be selected so that for a given vertical force applied a bond region 210, the maximum stress in bending is approximately the same at any location along the length of the beam. Preferably, the ratio of the moment of inertia of the tapered section to the bending moment induced by the vertical force at the bond region is uniform.

The tapered section may overlap the edge 218 of the body. Preferably, the tapered section blends smoothly into the adjacent part of the connection section 204 and into the fixed or first end 206 of the lead. Components as illustrated in FIG. 13 are used in the same manner as described above. Here again, each lead is broken at frangible section 212 so as to detach the second end of the connection section from the body. The bond region is moved downwardly, and desirably also moved horizontally in a longitudinal direction towards the first end 206, as well as in a sideways horizontal direction for the reasons discussed above. This movement bends the lead downwardly and forms it into a generally S-shaped configuration. The tapered section 216 promotes formation of a gradual, curved bend in the lead adjacent first end 206 and adjacent the edge 218 of the connection component body. That is, the tapered section helps to prevent kinking of the lead at this location. Further, during service of the completed device, the tapered section and the gradual curve formed as a result of the tapered section, help to resist fatigue stress caused by repeated flexing of the lead.

In the arrangement illustrated in FIG. 13, the lead is generally planar prior to the bonding operation and the tapered section 216 is defined by a pair of opposed walls sloping towards one another in such plane, i.e., in the horizontal directions indicated by arrows F and S. Other configurations may be used. For example, the straight walls defining section 216 can be replaced by gradually curved walls, again progressively narrowing the lead in the direction towards the second end 208. Also, the lead may have uniform width in the plane illustrated, but may taper gradually in thickness (in the vertical direction, perpendicular to the plane of the drawing as seen in FIG. 13 in the same region. Tapering thickness may be used in conjunction with tapering width. Any of these alternatives can be employed to provide a lead having moment of inertia about a horizontal medial plane progressively decreasing in the direction away from the first end 206 in the tapering region 216.

Numerous variations and combinations of the features set forth above can be utilized without departing from the present invention. Each lead may be provided with frangible sections defined by a single notch extending inwardly from one side, rather than by two notches as illustrated. Alternatively, the frangible section may have a groove in the top or bottom surface of the lead, or grooves in both such surfaces. Alternatively or additionally, the frangible section may have different composition or hardness than the other portions of the lead.

The lead need not incorporate a frangible section at all. Thus, the second end of the connection section of each lead may be releasably attached to the connection component body so that the second end is supported until the bonding operation and then detached when the tool displaces the connection section downwardly.

Additionally, the present invention can be applied with connection components wherein the second ends of the connection components are not supported by the connection component body prior to the bonding operation. Components such as conventional TAB tape typically include rows of leads disposed in rows, side by side at edges of a bond window. Each such lead is attached to the component body only at its first end; the second end is supported only by the lead itself. Each lead forms a self-supporting cantilever beam. The present invention can be applied to components of this type.

Moreover, the rows of leads need not be disposed adjacent the periphery of the chip and connection component. Any lead location which matches the placement of contacts on the chip or other component to be bonded can be used. Where the chip or other component has one or more rows of contacts adjacent the center of its contact-bearing face, the connection component will have a corresponding row of leads adjacent the center of the components.

In the embodiments illustrated above, only one lead is engaged and bonded on each cycle. However, the invention can also be applied in "gang bonding", wherein the bonding tool engages a plurality of leads on each cycle. Such a tool may include a platelike tip with a plurality of slots side-by-side for engaging plural leads, and may be moved in substantially the same way as described above on each bonding cycle. On each cycle, however, the tool would be shifted along the row by a greater distance, so as to engage a plurality of new leads on the next cycle. Various features of the invention can be omitted. For example, the projection or projections on each lead can be omitted where frictional engagement between the lead and bonding tool is sufficient to form the S-shaped bend.

TABLE I

| Pitch of the Connection Pads P microns | Width of the Connection Pad W microns | Width of The Bonding Tool T microns | Width of the Connection Lead at the Connection Section S microns | Width of the Bond Region of the Connection Lead at the Connection Section Bonded to the Connection Pad F microns | Allowable Deviation Between the Center of the Tool and the Center of the Connection Pad B microns |
|---|---|---|---|---|---|
| 100 | 60 | 100 | 38 | 48 | 8 |
| 80 | 50 | 85 | 32 | 40 | 6 |
| 65 | 45 | 80 | 28 | 36 | 5 |
| 60 | 40 | 75 | 25 | 31 | 4 |
| 55 | 35 | 70 | 22 | 28 | 3 |
| 52 | 35 | 70 | 20 | 25 | 3 |

TABLE II

| Nominal Offset Between Center of the Pad and the Center of the Connection Section in the Juxtaposed Condition A microns | Tolerance or Maximum Deviation From Nominal Value of Offset tol. Microns (+/−) | Range of Actual Offset Values Microns |
|---|---|---|
| 25 | 25 | 50–0 |
| 22.5 | 22.5 | 45–0 |
| 20 | 20.0 | 40–0 |
| 15 | 15 | 30–0 |
| 12.5 | 12.5 | 25–0 |
| 12.5 | 12.5 | 25–0 |

We claim:

1. A microelectronic connection component comprising:
(a) a support structure; and
(b) a plurality of electrically conductive leads, each such lead having an elongated connection section, each connection section having a first end secured to said support structure and a second end movable with respect to said support structure, each said lead extending across an edge of the support structure adjacent the first end of the connection section and extending in a lengthwise direction from said support structure, whereby each said connection section can be engaged by a tool and bent downwardly to engage a contact after the component has been positioned on a part of a microelectronic assembly, each said connection section having a tapered portion adjacent the edge, each such tapered portion having moment of inertia in bending about a horizontal neutral axis decreasing progressively in the lengthwise direction away from the first end of the lead and away from the edge of the support structure.

2. A component as claimed in claim 1 wherein each said tapered portion extends across said edge.

3. A component as claimed in claim 1 wherein each said lead includes a bond region remote from said first end adapted to be engaged by a bonding tool and wherein each said tapered region approximates a beam of uniform strength in bending with respect to vertical forces applied in said bond region.

4. A component as claimed in claim 3 wherein each said connection section includes a projection extending transverse to the direction of elongation and said bond region of each lead is immediately adjacent said projection on the side thereof remote from the first end of the lead.

* * * * *

UNITED STATES PATENT AND TRADEMARK OFFICE
CERTIFICATE OF CORRECTION

PATENT NO. : 5,619,017
DATED : April 8, 1997
INVENTOR(S) : DiStefano et al.

It is certified that error appears in the above-identified patent and that said Letters Patent is hereby corrected as shown below:

Column 1, line 50, after "to" delete "a".

Column 2, line 39, after the word "tool" delete "along with the tool. If tool allowing the tool to move" and insert --If the tool moves --.

Column 3, line 33, change "hay" to read --may--.
         line 46, after the word "connecting" delete "a".
         line 60, change "Opposite" to read -- opposite --.

Column 4, line 40, after "may" delete "be" and after "or" delete "a".

Figure 3:
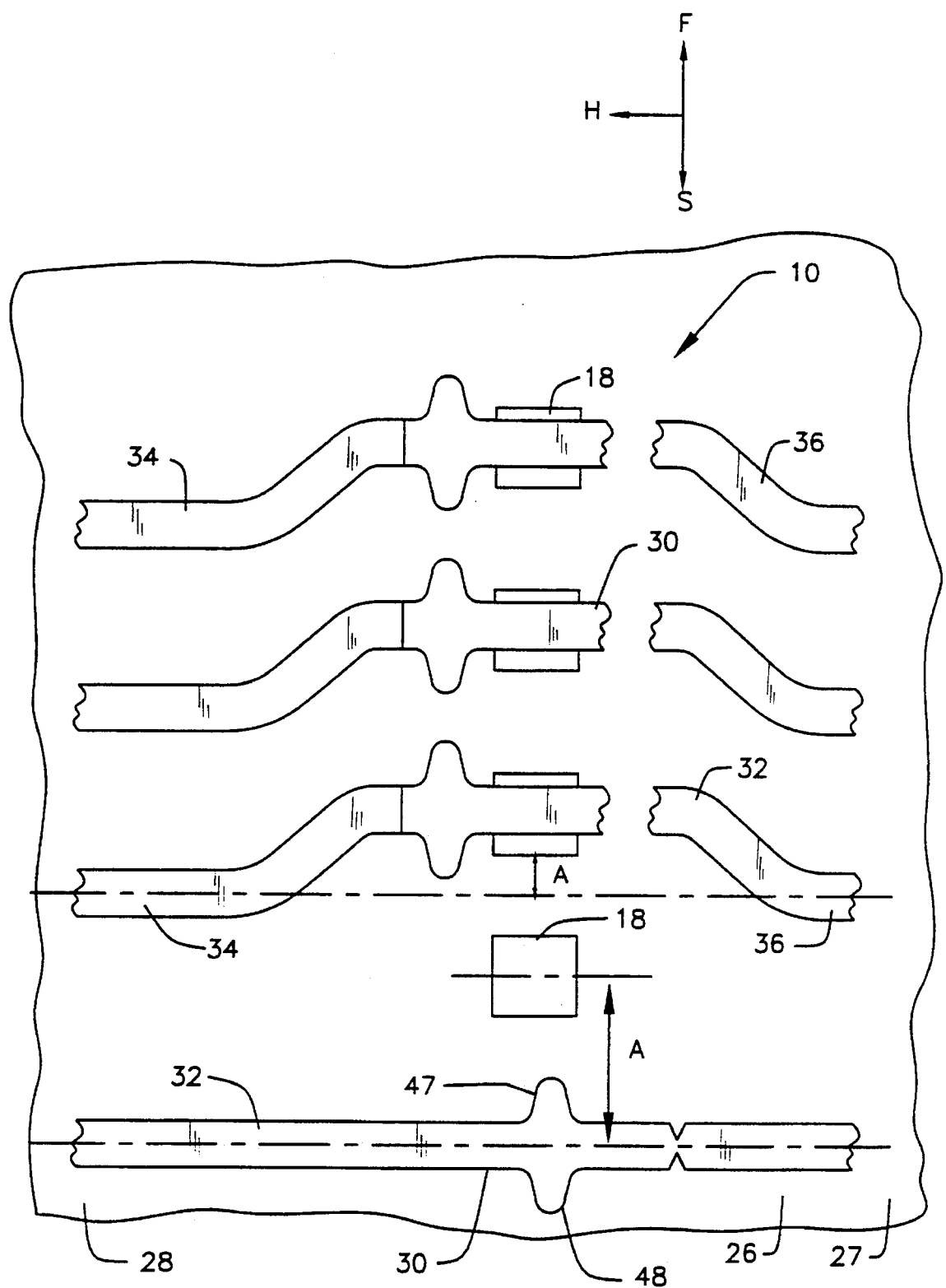
FIG. 3 As a top plan view showing connection between the semiconductor chip assembly and the connection component.

Column 5, line 8, after "FIG. 3" change "As" to --is--.
         line 47, after the word "invention" change "pertain" to read -- pertains --.
         line 51, before the word "top" delete the period.

Column 7, line 35, after the word "section" insert a period.
         line 51, change "reflects" to read -- reflect --.
         line 55, change "it" to read -- its --.

Column 10, line 50, after the word "movement" insert -- is --.
         line 56, after the word "during" delete "with".

UNITED STATES PATENT AND TRADEMARK OFFICE
CERTIFICATE OF CORRECTION

PATENT NO. : 5,619,017
DATED : April 8, 1997
INVENTOR(S) : DiStefano et al.

It is certified that error appears in the above-identified patent and that said Letters Patent is hereby corrected as shown below:

Column 11, line 29, after the word "appearance" insert -- of --.

Column 12, line 9, change "connecting" to read -- connects --.
line 54, change "decrease" to read -- decreases --.

Signed and Sealed this

Twenty-second Day of July, 1997

Attest:

BRUCE LEHMAN

Attesting Officer

Commissioner of Patents and Trademarks